United States Patent
Karim et al.

(10) Patent No.: US 7,205,240 B2
(45) Date of Patent: Apr. 17, 2007

(54) HDP-CVD MULTISTEP GAPFILL PROCESS

(75) Inventors: M. Ziaul Karim, San Jose, CA (US); Bikram Kapoor, Santa Clara, CA (US); Anchuan Wang, Fremont, CA (US); Dong Qing Li, Santa Clara, CA (US); Katsunari Ozeki, Chiba (JP); Manoj Vellaikal, Santa Clara, CA (US); Zhuang Li, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 413 days.

(21) Appl. No.: 10/456,611

(22) Filed: Jun. 4, 2003

(65) Prior Publication Data

US 2004/0245091 A1 Dec. 9, 2004

(51) Int. Cl.
*C23C 16/00* (2006.01)

(52) U.S. Cl. .............. 438/694; 438/695; 438/692; 438/424; 438/435; 427/255.23; 427/255.28; 427/255.37; 216/59; 216/67; 216/79; 156/345.24; 156/345.33; 156/345.48; 118/696; 118/697; 118/723 I; 118/723 IR

(58) Field of Classification Search .......... 204/192.3, 204/192.32; 427/255.23, 255.28, 255.37; 438/424, 435, 694, 695, 692; 216/67, 79, 216/59; 156/345.33, 345.24, 345.48; 118/723 R, 118/723 I, 723 IR, 696, 697

See application file for complete search history.

(56) References Cited

U.S. PATENT DOCUMENTS

| | | | |
|---|---|---|---|
| 4,468,413 A | 8/1984 | Bachmann | |
| 4,690,746 A | 9/1987 | McInerney et al. | |
| 4,737,379 A | 4/1988 | Hudgens et al. | |
| 4,835,005 A | 5/1989 | Hirooka et al. | |
| 4,851,370 A | 7/1989 | Doklan et al. | |
| 4,872,947 A | 10/1989 | Wang et al. | |
| 4,890,575 A | 1/1990 | Ito et al. | |
| 4,892,753 A | 1/1990 | Wang et al. | |
| 4,894,352 A | 1/1990 | Lane et al. | |

(Continued)

FOREIGN PATENT DOCUMENTS

GB 2 267 291 A 12/1993

(Continued)

OTHER PUBLICATIONS

Translation of JP 2002-141349.*
Abraham, "Reactive Facet Tapering of Plasma Oxide For Multilevel Interconnect Applications," VMIC Conference, pp. 115-121 (1987).

(Continued)

*Primary Examiner*—Rodney G. McDonald
(74) *Attorney, Agent, or Firm*—Townsend and Townsend and Crew

(57) ABSTRACT

A gapfill process is provided using cycling of HDP-CVD deposition, etching, and deposition step. The fluent gas during the first deposition step includes an inert gas such as He, but includes $H_2$ during the remainder deposition step. The higher average molecular weight of the fluent gas during the first deposition step provides some cusping over structures that define the gap to protect them during the etching step. The lower average molecular weight of the fluent gas during the remainder deposition step has reduced sputtering characteristics and is effective at filling the remainder of the gap.

36 Claims, 9 Drawing Sheets

U.S. PATENT DOCUMENTS

| | | |
|---|---|---|
| 4,960,488 A | 10/1990 | Law et al. |
| 5,000,113 A | 3/1991 | Wang et al. |
| 5,013,691 A | 5/1991 | Lory et al. |
| 5,089,442 A | 2/1992 | Olmer |
| 5,156,881 A | 10/1992 | Okano et al. |
| 5,215,787 A | 6/1993 | Homma |
| 5,271,972 A | 12/1993 | Kwok et al. |
| 5,275,977 A | 1/1994 | Otsubo et al. |
| 5,279,865 A | 1/1994 | Chebi et al. |
| 5,288,518 A | 2/1994 | Homma |
| 5,302,233 A | 4/1994 | Kim et al. |
| 5,314,724 A | 5/1994 | Tsukune et al. |
| 5,319,247 A | 6/1994 | Matsuura |
| 5,334,552 A | 8/1994 | Homma |
| 5,362,526 A | 11/1994 | Wang et al. |
| 5,385,763 A | 1/1995 | Okano et al. |
| 5,399,529 A | 3/1995 | Homma |
| 5,413,967 A | 5/1995 | Matsuda et al. |
| 5,416,048 A | 5/1995 | Blalock et al. |
| 5,420,075 A | 5/1995 | Homma et al. |
| 5,429,995 A | 7/1995 | Nishiyama et al. |
| 5,468,342 A | 11/1995 | Nulty et al. |
| 5,474,589 A | 12/1995 | Ohga et al. |
| 5,554,418 A * | 9/1996 | Ito et al. .................... 427/579 |
| 5,563,105 A | 10/1996 | Dobuzinsky et al. |
| 5,571,576 A | 11/1996 | Qian et al. |
| 5,599,740 A | 2/1997 | Jang et al. |
| 5,624,582 A | 4/1997 | Cain |
| 5,645,645 A | 7/1997 | Zhang et al. |
| 5,648,175 A | 7/1997 | Russell et al. |
| 5,661,093 A | 8/1997 | Ravi et al. |
| 5,679,606 A | 10/1997 | Wang et al. |
| 5,712,185 A | 1/1998 | Tsai et al. |
| 5,719,085 A | 2/1998 | Moon et al. |
| 5,804,259 A | 9/1998 | Robles |
| 5,850,105 A | 12/1998 | Dawson et al. |
| 5,858,876 A | 1/1999 | Chew |
| 5,872,052 A | 2/1999 | Iyer |
| 5,872,058 A * | 2/1999 | Van Cleemput et al. .... 438/692 |
| 5,910,342 A | 6/1999 | Hirooka et al. |
| 5,913,140 A | 6/1999 | Roche et al. |
| 5,915,190 A | 6/1999 | Pirkle |
| 5,937,323 A | 8/1999 | Orczyk et al. |
| 5,939,831 A | 8/1999 | Fong et al. |
| 5,944,902 A | 8/1999 | Redeker et al. |
| 5,953,635 A | 9/1999 | Andideh |
| 5,968,610 A | 10/1999 | Liu et al. |
| 5,976,327 A | 11/1999 | Tanaka |
| 5,990,000 A | 11/1999 | Hong et al. |
| 5,990,013 A | 11/1999 | Berenguer et al. |
| 6,013,191 A | 1/2000 | Nasser-Faili et al. |
| 6,013,584 A | 1/2000 | M'Saad |
| 6,030,881 A * | 2/2000 | Papasouliotis et al. ...... 438/424 |
| 6,037,018 A | 3/2000 | Jang et al. |
| 6,039,851 A | 3/2000 | Iyer |
| 6,059,643 A | 5/2000 | Hu et al. |
| 6,136,685 A | 10/2000 | Narwankar et al. |
| 6,167,834 B1 | 1/2001 | Wang et al. |
| 6,170,428 B1 | 1/2001 | Redeker et al. |
| 6,182,602 B1 | 2/2001 | Redeker et al. |
| 6,189,483 B1 | 2/2001 | Ishikawa et al. |
| 6,190,233 B1 | 2/2001 | Hong et al. |
| 6,191,026 B1 | 2/2001 | Rana et al. |
| 6,194,038 B1 | 2/2001 | Rossman |
| 6,197,705 B1 | 3/2001 | Vassiliev |
| 6,203,863 B1 | 3/2001 | Liu et al. |
| 6,217,658 B1 | 4/2001 | Orczyk et al. |
| 6,228,751 B1 | 5/2001 | Yamazaki et al. |
| 9,854,083 | 5/2001 | Tan et al. |
| 6,313,010 B1 | 11/2001 | Nag et al. |
| 6,335,288 B1 | 1/2002 | Kwan et al. |
| 6,395,150 B1 * | 5/2002 | Van Cleemput et al. ..................... 204/192.37 |
| 6,503,843 B1 | 1/2003 | Xia et al. |
| 6,596,654 B1 * | 7/2003 | Bayman et al. ............. 438/788 |
| 6,846,745 B1 * | 1/2005 | Papasouliotis et al. ...... 438/706 |

FOREIGN PATENT DOCUMENTS

| | | |
|---|---|---|
| JP | 61-276-977 A | 12/1986 |
| JP | 2-58836 A | 2/1990 |
| JP | 4-239750 | 8/1992 |
| JP | 4-341568 | 11/1992 |
| JP | 7-161703 A | 6/1995 |
| JP | 2002-141349 * | 5/2002 |
| WO | WO 92/20833 | 11/1992 |

OTHER PUBLICATIONS

Chang et al. "Frequency Effects and Properties of Plasma Deposited Fluorinated Silicon Nitride", American Vacuum Society. 1988. pp. 524-532.

Fukada et al. "Preparation of SiOF Films with Low Dielectric Constant By ECR Plasma CVD", Japan. DUMIC Conference. Feb. 1995. pp. 43-49.

Galiano et al. "Stress-Temperature Behavior of Oxide Films Used for Intermetal Dielectric Applications", VMIC Conference. Jun. 1992. pp. 100-106.

Laxman, "Low e Dielectrics: CVD Fluorinated Silicon Dioxides", Semiconductor International. May 1995. pp.71-74.

Lee et al., "Dielectric Planarization Techniques For Narrow Pitch Multilevel Interconnects," VMIC Conference, pp. 85-92 (1987).

Matsuda et al. "Dual Frequency Plasma CVD Fluorosilicate Glass: Deposition for 0.25 um Interlevel Dielectrics", DUMIC Conference. Feb. 1995. pp. 22-28.

Musaka, "Single Step Gap Filling Technology fo Subhalf Micron Metal Spacings on Plasma Ehnahced TEOS/02 Chemical Vapor Deposition System," International Conference on Solid State Devices and Materials pp. 510-512, held in Japan, (1993).

Nalwa, H.S., *Handbook of Low and High Dielectric Constant Materials and Their Applications*, vol. 1, p. 66 (1999).

Nguyen, s.v., "High-Density Plasma Chemical Vapor Deposition of Silicon-Based Dielectric Films for Integrated Circuits," *Journal of Research and Development*, vol. 43, 1/2 (1999).

Qian et al., "High Density Plasma Deposition and Deep Submicron Gap Fill with Low Dielectric Constant SiOF Films," DUMIC Conference, pp. 50-56, held in California (1995).

Robles et al., "Effects of RF Frequency and Deposition Rates on the Moisture Resistance of PECVD TEOS-Based Oxide Films", ECS Extended Abstracts. vol. 92-1. May 1992. pp.215-216.

Shapiro et al., "Dual Frequency Plasma CVD Fluorosilicate Glass: Water Absorption And Stability", DUMIC Conference. Feb. 1995. pp. 118-123.

Usami et al. "Low Dielectric Constant Interlayer Using Fluorine-Doped Silicon Oxide", Jpn. J. Appl. Phys. vol. 33, Jan. 1994, pp. 408-412.

Vassiliev et al., "Trends in Void-Free Pre-Metal CVD Dielectrics," *Solid State Technology*, pp. 129-136 (Mar. 2001).

Yu et al. "Step Coverage Study of Peteos Deposition for Intermetal Dielectric Applications", VMIC Conference. Jun. 1990. pp. 166-172.

* cited by examiner

HDP-CVD MULTISTEP GAPFILL PROCESS

BACKGROUND OF THE INVENTION

One of the persistent challenges faced in the development of semiconductor technology is the desire to increase the density of circuit elements and interconnections on substrates without introducing spurious interactions between them. Unwanted interactions are typically prevented by providing gaps or trenches that are filled with electrically insulative material to isolate the elements both physically and electrically. As circuit densities increase, however, the widths of these gaps decrease, increase their aspect ratios and making it progressively more difficult to fill the gaps without leaving voids. The formation of voids when the gap is not filled completely is undesirable because they may adversely affect operation of the completed device, such as by trapping impurities within the insulative material.

Common techniques that are used in such gapfill applications are chemical-vapor deposition ("CVD") techniques. Conventional thermal CVD processes supply reactive gases to the substrate surface where heat-induced chemical reactions take place to produce a desired film. Plasma-enhanced CVD ("PECVD") techniques promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes when compared with conventional thermal CVD processes. These advantages may be further exploited by high-density-plasma ("HDP") CVD techniques, in which a dense plasma is formed at low vacuum pressures so that the plasma species are even more reactive. While each of these techniques falls broadly under the umbrella of "CVD techniques," each of them has characteristic properties that make them more or less suitable for certain specific applications.

In some instances where gaps have a large aspect ratio and narrow width, gaps have been filled with thermal CVD techniques using a "dep/etch/dep" process by sequentially depositing material, etching some of it back, and depositing additional material. The etching step acts to reshape the partially filled gap, opening it so that more material can be deposited before it closes up and leaves an interior void. Such dep/etch/dep processes have also been used with PECVD techniques, but some thermal and PECVD techniques are still unable to fill gaps having very large aspect ratios even by cycling deposition and etching steps.

Cycling of deposition and etching steps was traditionally viewed by those of skill in the art as inutile in the context of HDP-CVD processes. This view resulted from the fact that, very much unlike PECVD processes, the high density of ionic species in the plasma during HDP-CVD processes causes there to be sputtering of a film even while it is being deposited. This simultaneous sputtering and deposition of material during a deposition process tends to keep the gap open during deposition, and was therefore believed to render a separate intermediate etching step superfluous. This prevailing view proved to be partially correct in that much higher aspect-ratio gaps could be filled using an HDP-CVD process than could be filled even with a PECVD dep/etch/dep process. Nevertheless, in U.S. Pat. No. 6,194,038, filed Mar. 20, 1998 by Kent Rossman, the unexpected result was demonstrated that gapfill could be improved even further by using a dep/etch/dep process under certain HDP-CVD process conditions. This result was later confirmed in U.S. Pat. No. 6,030,181, filed May 5, 1998 by George D. Papasouliotis et al.

The use of HDP-CVD dep/etch/dep processes has been valuable in permitting gaps with higher aspect ratios to be filled, but limits have remained to the scope of their use. As the trend towards more densely packed devices continues, it is desirable to improve HDP-CVD dep/etch/dep processes to accommodate increasing aspect ratios of gaps.

BRIEF SUMMARY OF THE INVENTION

Embodiments of the invention thus provide a dep/etch/dep process in which a gap is filled with a first HDP-CVD deposition step, followed by an etching step, followed by a remainder HDP-CVD deposition step. The precursor gases used in each of the deposition steps may be similar and comprise a silicon-containing gas and an oxygen-containing gas to deposit a silicon oxide film for filling a gap in a surface of a substrate. The fluent gas during the remainder deposition has a lower average molecular weight than the fluent gas during the first deposition step. For example, the fluent gas during the first deposition step may comprise an inert gas and during the remainder deposition step may comprise $H_2$. The higher average molecular weight of the fluent gas during the first deposition step provides some cusping over structures that define the gap to protect them during the etching step. The lower average molecular weight of the fluent gas during the remainder deposition step has reduced sputtering characteristics and is effective at filling the remainder of the gap.

There are a variety of different fluent gases that may be used during the first deposition step in different embodiments of the invention. For example, in one embodiment, the fluent gas comprises He. In another embodiment, it comprises a mixture of He and $H_2$. In a further embodiment, it comprises a mixture of two inert gases such as a mixture of Ar and He. The fraction of He in such a mixture may be greater than 95 wt. % He in one embodiment and may be greater than 99 wt. % He in another embodiment.

There are also a variety of different etchant gases that may be used, either to perform an in situ etching step or to perform a remote etching step. In embodiments of the invention, a fluorine-containing gas is used to perform the etch, such as by using an etching gaseous mixture comprising the fluorine-containing gas, an oxygen-containing gas, He, and Ar. An electrical bias may also be applied during the etching step. In some instances, the film may be passivated after the etching step by exposure to a passivating gas such as $O_2$.

The first deposition step may be used to fill between 35% and 85% of a depth of the gap and the etching step may remove between 5% and 15% of a thickness of the amount deposited. The process parameters during the deposition steps may be characterized in terms of a deposition/sputter ratio, defined as a ratio of a sum of a net deposition rate and a blanket sputtering rate to the blanket sputtering rate. For the first deposition step, a deposition/sputter ratio within the range of 10–30 may be suitable. For the remainder deposition step, a deposition/sputter ratio within the range of 4–10 may be suitable.

In certain embodiments, a further deposition step may be performed after the first deposition step and before the etching step using $H_2$ as a fluent gas. Such an embodiment takes advantage of the better gapfill capability when $H_2$ is used, but retains the first deposition using an inert gas to provide protective material over the substrate structures. A suitable deposition/sputter ratio for this deposition step is within the range of 5–15. In such cases, the first deposition may be used to fill between 40% and 65% of the a depth of the gap, with this second deposition being used to fill an additional 20%–45% of the depth of the gap.

The methods of the present invention may be embodied in a computer-readable storage medium having a computer-readable program embodied therein for directing operation of a substrate processing system. Such a system may include a process chamber, a substrate holder, a pressure-control system, and a gas-delivery system. The computer-readable program includes instructions for operating the substrate processing system to deposit a film in accordance with the embodiments of the present invention.

A further understanding of the nature and advantages of the present invention may be realized by reference to the remaining portions of the specification and the drawings.

DETAILED DESCRIPTION OF THE INVENTION

1. Introduction

Embodiments of the invention are directed to methods and apparatus for depositing a film to fill a gap in a surface of a substrate. For gaps of a given width, these embodiments use a multistep deposition and etching process and exploit different sputtering characteristics of an HDP-CVD technique in different portions of the process. These different sputtering characteristics are achieved by the use of different fluent gases to provide the sputtering agent and also by adjusting flow rates of process gases to achieve different deposition-to-sputtering ratios. The combination of effects provided by the cycling of deposition and etching steps and by the variation in sputtering characteristics combine synergistically to permit substantially void-free filling of gaps having very high aspect ratios. In particular, the embodiments of the invention may be used for filling gaps in 100-nm technology (0.10 µm) and at least down to 65-nm technology (0.065 µm). The embodiments described herein are suitable for a variety of different gapfill applications, including, for example, shallow-trench-isolation applications.

Figure 1A:
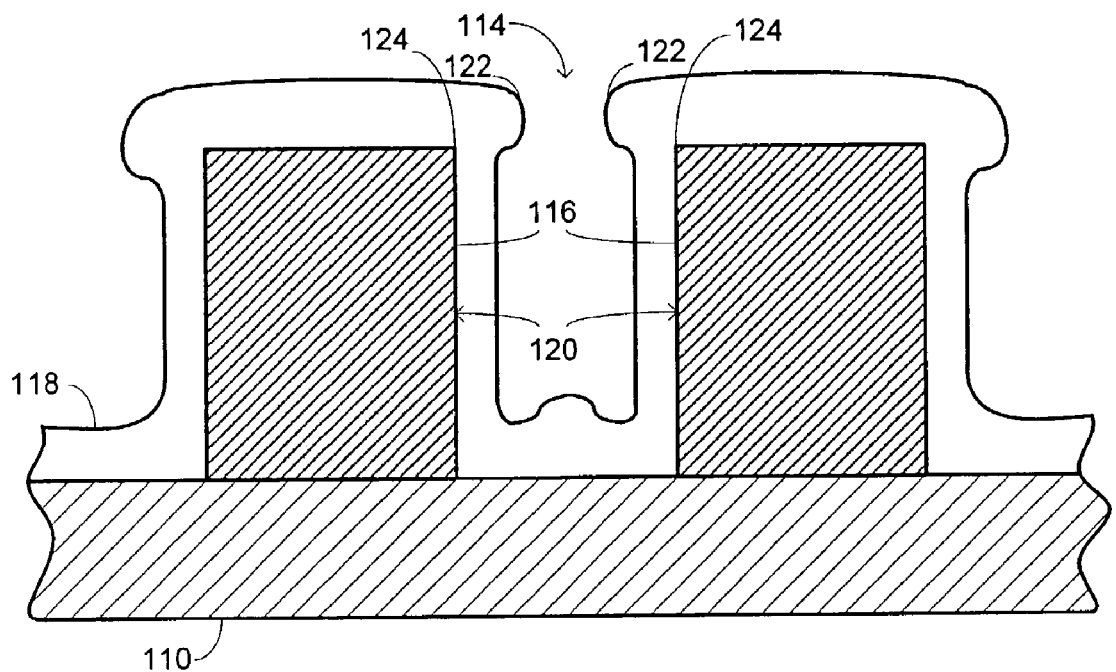
FIGS. 1A and 1B are schematic cross-sectional drawings illustrating the formation of a void during a gapfill process.
Figure 1B:
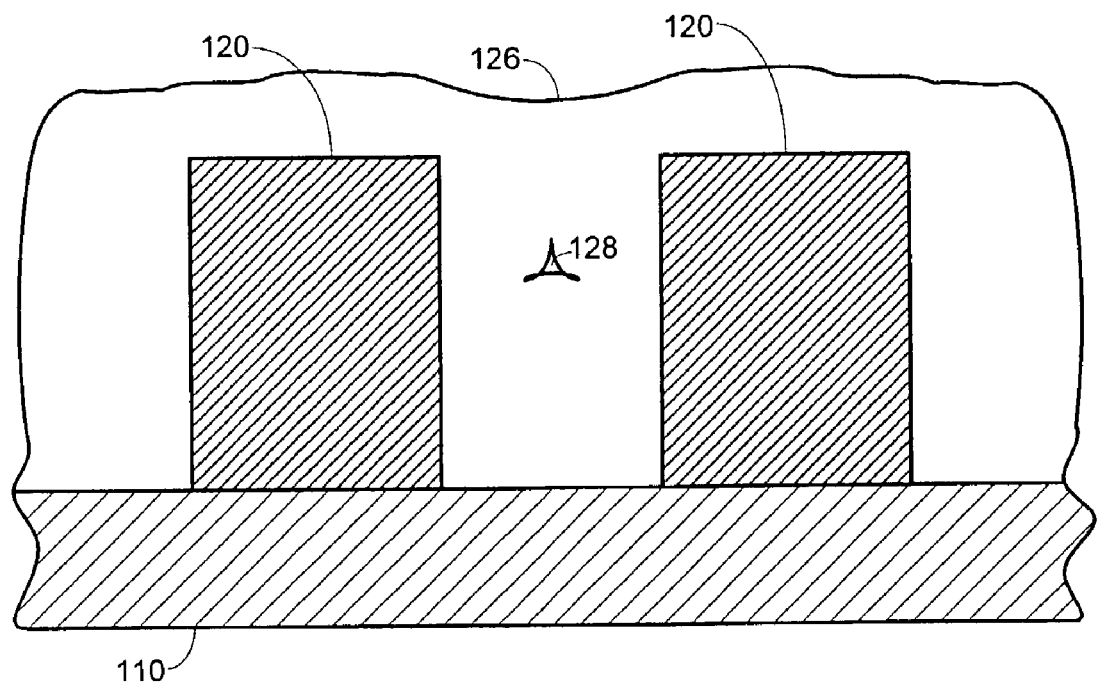

The gapfill problem addressed by embodiments of the invention is illustrated schematically with the cross-sectional views shown in FIGS. 1A and 1B. FIG. 1A shows a vertical cross section of a substrate 110, such as may be provided with a semiconductor wafer, having a layer of features 120. Adjacent features define gaps 114 that are to be filled with dielectric material 118, with the sidewalls 116 of the gaps being defined by the surfaces of the features 120. As the deposition proceeds, dielectric material 118 accumulates on the surfaces of the features 120, as well as on the substrate 110 and forms overhangs 122 at the corners 124 of the features 120. As deposition of the dielectric material 118 continues, the overhangs 122 typically grow faster than the gap 114 in a characteristic breadloafing fashion. Eventually, the overhangs 122 grow together to form the dielectric layer 126 shown in FIG. 1B, preventing deposition into an interior void 128.

2. Deposition Parameters

The deposition processes described herein have improved gapfill capability that avoids the formation of such as interior void. The HDP-CVD deposition processes act by providing a gaseous mixture to a process chamber, such as by using the deposition system described in detail below. A high-density plasma is generated from the gas mixture, with "high density" being characterized by the plasma having an ion density greater than about $10^{11}$ ions/cm$^3$. The relative levels of the combined deposition and sputtering characteristics of the high-density plasma may depend on such factors as the flow rates used to provide the gaseous mixture, the source power levels applied to maintain the plasma, the bias power applied to the substrate, and the like. The combination of such factors may conveniently be quantified with a "deposition/sputter ratio," sometimes denoted D/S to characterize the process:

$$\frac{D}{S} \equiv \frac{\text{(net deposition rate)} + \text{(blanket sputtering rate)}}{\text{(blanket sputtering rate)}}.$$

The deposition/sputter rate increases with increased deposition and decreases with increased sputtering. As used in the definition of D/S, the "net deposition rate" refers to the deposition rate that is measured when deposition and sputtering are occurring simultaneously. The "blanket sputter rate" is the sputter rate measured when the process recipe is run without deposition gases; the pressure within the process chamber is adjusted to the pressure during deposition and the sputter rate measured on a blanket thermal oxide.

Other equivalent measures may be used to quantify the relative deposition and sputtering contributions of the HDP process, as is known to those of skill in the art. A common alternative ratio is the "etching/deposition ratio,"

$$\frac{E}{D} \equiv \frac{(\text{source} - \text{only deposition rate}) - (\text{net deposition rate})}{(\text{source} - \text{only deposition rate})},$$

which increases with increased sputtering and decreases with increased deposition. As used in the definition of E/D, the "net deposition rate" again refers to the deposition rate measured when deposition and sputtering are occurring simultaneously. The "source-only deposition rate," however, refers to the deposition rate that is measured when the process recipe is run with no sputtering. Embodiments of the invention are described herein in terms of D/S ratios. While D/S and E/D are not precise reciprocals, they are inversely related and conversion between them will be understood to those of skill in the art.

The desired D/S ratios for a given step in the HDP-CVD processes are generally achieved by including flows of precursor gases and flows of a fluent gas, which may also act as a sputtering agent. The elements comprised by the precursor gases react to form the film with the desired composition. For example, to deposit a silicon oxide film, the precursor gases may include a silicon-containing gas, such as silane $SiH_4$, and an oxygen-containing gas, such as $O_2$. Dopants may be added to the film by including a precursor gas with the desired dopant, such as by including a flow of $SiF_4$ to fluorinate the film, including a flow of $PH_3$ to phosphorate the film, including a flow of $B_2H_6$ to boronate the film, including a flow of $N_2$ to nitrogenate the film, and the like. The fluent gas may be provided with a flow of $H_2$ or with a flow of an inert gas, including a flow of He, a flow of Ne, a flow of Ar, or a flow of a heavier inert gas such as Xe. The level of sputtering provided by the different fluent gases is inversely related to their atomic mass (or molecular mass in the case of $H_2$), with $H_2$ producing even less sputtering than He. In some embodiments of the invention discussed in greater detail below, the sputtering agent is provided with a premixture of at least two of these gases.

Embodiments of the invention use at least two deposition steps having different fluent-gas flows in an HDP-CVD process. In particular instances, the second deposition step is performed using a fluent gas having a lower average molecular mass than the fluent gas used in the first deposition step. In some embodiments, the two deposition steps are separated by an etching step, but in other embodiments, the two deposition steps are followed by an etching step and a further deposition step. The different steps may be performed in situ in a single chamber, may be performed in situ in a multichamber system, or may be performed ex situ in different embodiments. Also, while embodiments are described generally in terms of a single dep/etch/dep cycle, more aggressive gapfill may be achieved by using multiple cycles, such as a dep/etch/dep/etch/dep cycle or an even more extended repetition of cycles.

Figure 2:
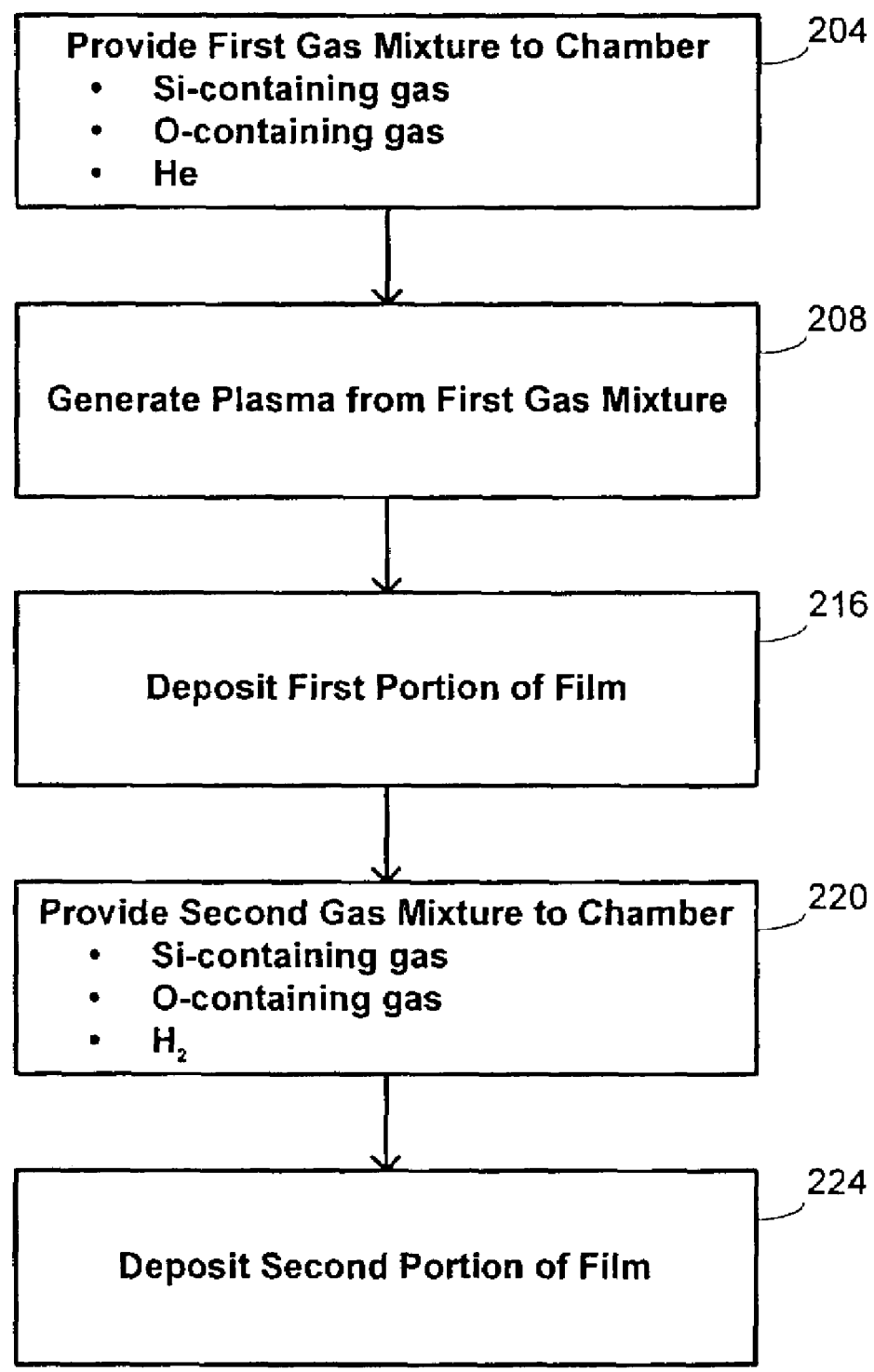
FIG. 2 is a flow diagram illustrating a method for depositing a film to fill a gap in one embodiment of the invention.

The sequence of the two deposition steps is illustrated with the flow diagram shown in FIG. 2 in which the first deposition step is carried out using He as a fluent gas and the second deposition step is carried out using $H_2$ as a fluent gas. At block 204, a first gaseous mixture suitable for depositing a first portion of a silicon oxide film is provided to the process chamber. The precursor gases of the first gaseous mixture comprise a Si-containing gas such as $SiH_4$ and an oxygen-containing gas such as $O_2$, and the fluent gas of the first gaseous mixture comprises He. In some embodiments, the fluent gas may comprise a premixture of He and another inert gas such as Ar. Inclusion of the other inert gas provides better deposition uniformity than use of He alone and may permit a significant cost saving because of the relatively high cost of He sources compared with sources of other inert gases. These benefits are realized even where the amount of He used in the premixture is significantly greater than the amount of the other inert gas. For example, in one embodiment, the premixture comprises greater than 95 wt. % He and in another embodiment comprises greater than 99 wt. % He.

At block 208, a plasma is generated from the first gaseous mixture so that a first portion of the film may be deposited at block 216. In one embodiment, deposition of the first portion of the film has a D/S ratio in the range between 10 and 30. After the first portion of the film has been deposited, a second gaseous mixture is provided to the process chamber. The precursor gases of the second gaseous mixture comprise a Si-containing gas and an O-containing gas, and will usually be the same precursor gases used in providing the first gaseous mixture. The fluent gas of the gaseous mixture comprises $H_2$. At block 224, a second portion of the film is deposited using the second gaseous mixture. If a continuous process is used, it may be unnecessary specifically to generate a second plasma from the second gaseous mixture, although in other embodiments, such a second plasma may be generated. Also, suitable D/S ratios for the deposition of the second portion may depend on other aspects of complete process used. For example, if the two depositions are performed without an intermediate etching step, the D/S ratio for the second deposition may be between 3 and 10 in one embodiment. This is suitable for partial filling of the gap in a process in which the second deposition is followed by an etching step; examples of such processes are described in further detail below. If the two depositions are separated by an intermediate etching step, the D/S ratio may be between 4 and 10; examples of such processes are also described in further detail below.

3. Dep/Etch/Dep Processes

Figure 3:
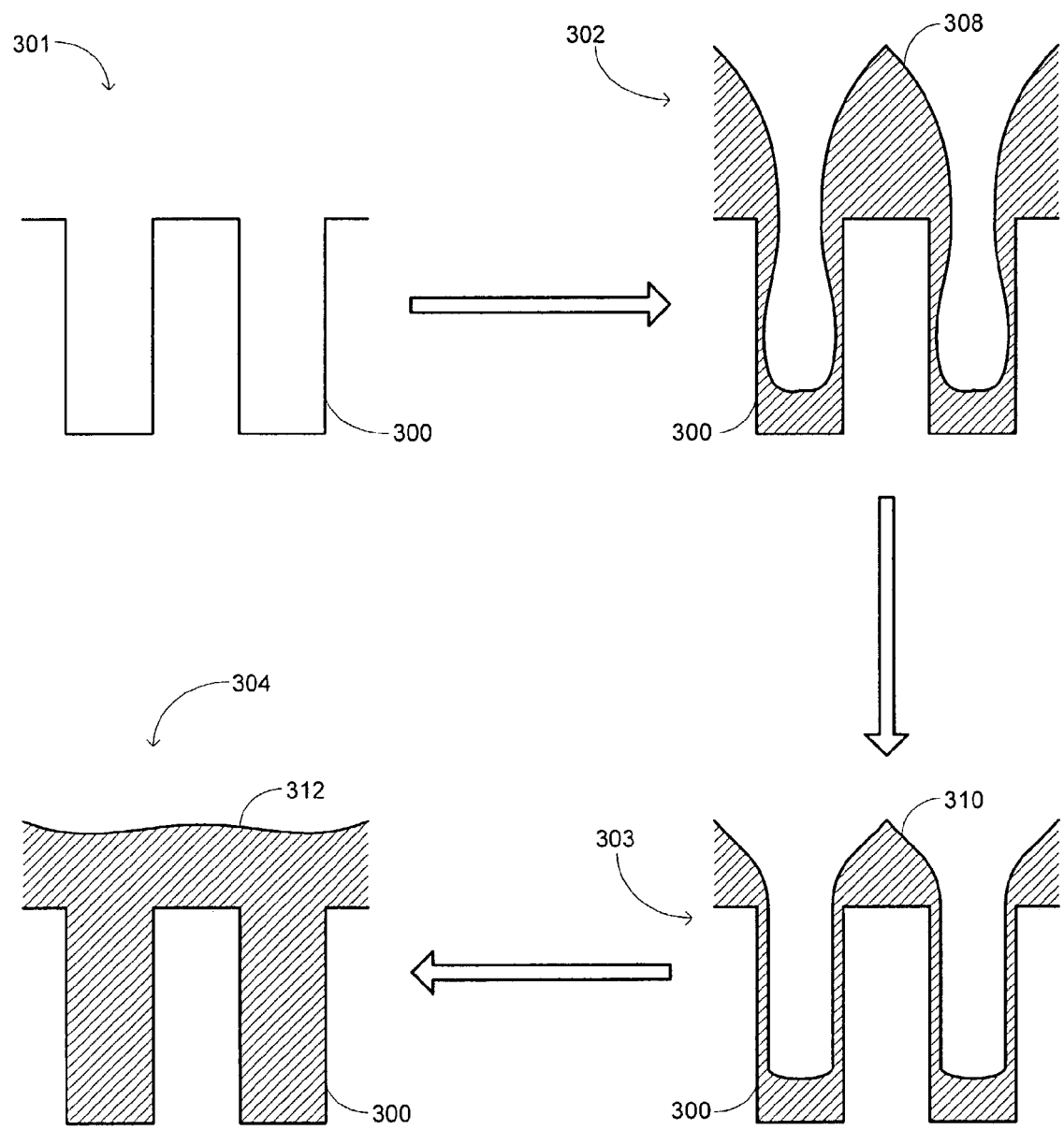
FIG. 3 provides schematic cross-sectional drawings illustrating how a high-aspect-ratio feature may be filled using a dep/etch/dep process according to an embodiment of the invention.

In embodiments of the invention that use the two deposition steps described above as part of a dep/etch/dep process, care is taken not to damage the underlying structures during the etching step. This may be accomplished with a combination of effects that include ensuring that sufficient material is deposited during the first deposition step to protect the underlying structures and that the etching conditions during the etching step do not etch away so much material that the structures are exposed. The patterns that result from process parameters that are used to achieve this combination of effects are illustrated schematically in FIG. 3.

The initial substrate structure 301 is shown schematically as including features 300 that are to be filled with a dielectric material. The process conditions for the first deposition result in the formation of a significant cusp 308, as shown for intermediate structure 302, with dielectric material being deposited more thickly near the corners of the underlying structures than on the sidewalls. Structure 302 may result from a single deposition using a first inert gas as the fluent gas or may result from the two-step deposition process in which a second deposition is performed using a fluent gas having a lower average molecular mass. The cusp feature is protective during the subsequent etching step, which results in structure 303. Performing the etch anisotropically, such as by applying a bias during a reactive etch, helps to shape the deposited layer 310 so that the basic shape of the original features 300 are retained, but are less severe, with the corners of the underlying structures remaining unexposed.

When the final deposition is performed, the features 300 may then be filled completely with dielectric material 312, such as shown schematically with structure 304.

Figure 4:
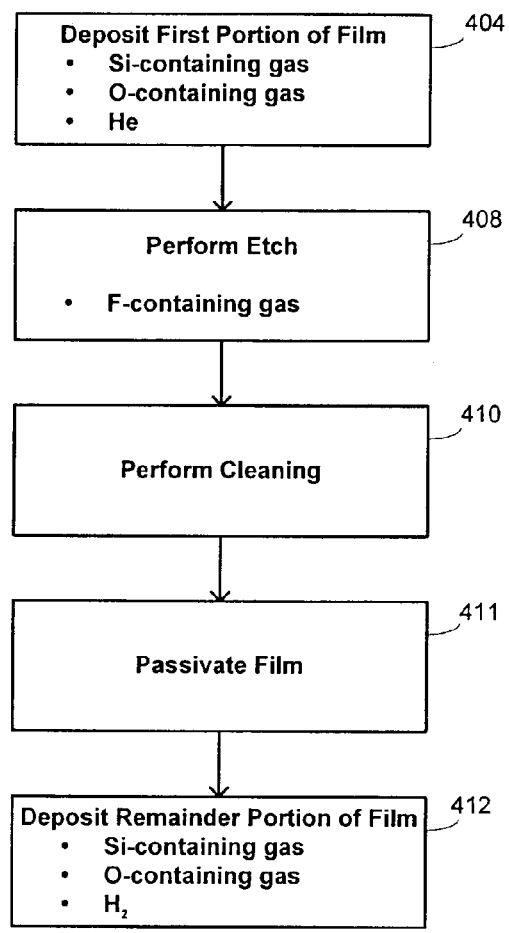
FIG. 4 is a flow diagram illustrating a method for depositing a film to fill a gap in another embodiment of the invention.

FIG. 4 provides a flow diagram for an exemplary embodiment for a dep/etch/dep process in which the first and second deposition steps described above are separated by an etching step. The first deposition is performed at block 404, corresponding to block 216 of FIG. 2, with a gaseous mixture that comprises a Si-containing gas such as $SiH_4$, an oxygen-containing gas such as $O_2$, and He as a fluent gas. The use of He as a fluent gas during such a deposition step is described further in copending, commonly assigned U.S. patent application Ser. No. 10/137,132, entitled "METHOD FOR HIGH ASPECT RATIO HDP CVD GAPFILL," filed Apr. 30, 2002 by Zhong Qiang Hua et al., the entire disclosure of which is herein incorporated by reference for all purposes. In some instances, additional gases may be included in the gaseous mixture for the reasons discussed above, such as by including an additional precursor gas to add a particular dopant to the silicon oxide film being deposited or by including an additional inert gas as the fluent gas to reduce costs and/or improve deposition uniformity. In specific embodiments, the fluent gas is provided by a flow from a premixture of He and Ar, such as with greater than 95 wt. % He or greater than 99 wt. % He, or by a flow of a premixture of He and $H_2$. Suitable D/S ratios for this first deposition are in the range 10–30, which produces sufficient cusping to protect underlying structures as discussed in connection with FIG. 3. This first deposition may be used to deposit between 35 and 85% of the depth of the gap.

The first deposition is followed by an etching step at block 408, which may be performed in situ or remotely. In some instances, the etching step may be preceded by a cooling step to lower the temperature of the substrate below about 250° C. and thereby provide better etch control. Such cooling may be performed, for example, by helium backside cooling of the substrate, among other methods. In certain in situ embodiments, a fluorine-containing gas such as $NF_3$ is flowed into the process chamber. In one specific embodiment, the etching step is performed with a gaseous mixture that comprises $NF_3$, $O_2$, He, and Ar. Approximately 5–15% of the deposited thickness of the silicon oxide film may be removed during the etching step, although the amount removed may vary at different points according to the profile of the film.

The etching step 408 may be performed anisotropically by providing an electrical bias to the substrate to attract ionic species. Since the chemical etching mechanism provided by the fluorine ions acts to reopen the gap, inclusion of an etching anisotropy can increase the efficiency of the process. A sufficient bias power to produce a reasonable anisotropic etching component for is a 200-mm wafer substrate is about 300 W and for a 300-mm wafer substrate is about 650 W, corresponding to a bias power density of about 0.9 $W/cm^2$. An upper limit for the bias power is approximately 1000 W for a 200-mm wafer substrate and about 2500 W for a 300-mm wafer substrate, corresponding to a bias power density of about 3.2 $W/cm^2$, at which point physical sputtering becomes significant. In one embodiment, the bias power density is in the range of 0.9–1.6 $W/cm^2$, corresponding to about 300–500 W for a 200-mm wafer substrate and to about 650–1200 W for a 300-mm wafer substrate. In certain embodiments, the etching step may comprise a multistep etching process that includes a first physical etch step and a subsequent chemical etch step, as described in copending, commonly assigned U.S. patent application Ser. No. 10/279,961, entitled "HIGH DENSITY PLASMA CVD PROCESS FOR GAPFILL INTO HIGH ASPECT RATIO FEATURES," filed Oct. 23, 2002 by Farhan Ahmad et al., the entire disclosure of which is herein incorporated by reference for all purposes.

In some embodiments, the surface of the etched film is passivated at block 411 prior to the next deposition step in order to remove fluorine that may be incorporated in the film due to the etching steps. In one embodiment, the surface of the film is passivated by exposing the substrate to a passivation gas that is selected to chemically react with the surface of the film to remove any fluorine atoms. Suitable passivating gases include molecular oxygen $O_2$, ozone 03, nitrous oxide $N_2O$, and molecular nitrogen $N_2$ in combination with any of the preceding. Further details of techniques that can be used to passivate the film after an etching step are discussed in copending, commonly assigned U.S. patent application Ser. No. 10/138,189, entitled "HDP-CVD DEP/ETCH/DEP PROCESS FOR IMPROVED DEPOSITION INTO HIGH ASPECT RATIO FEATURES," filed May 3, 2002 by Dongqing Li et al., the entire disclosure of which is herein incorporated by reference for all purposes.

The next deposition step is indicated at block 412 and, in this embodiment, corresponds to block 224 of FIG. 2. This deposition is described as depositing the "remainder portion" for consistency of terminology with the embodiment described with respect to FIG. 6 below, in which two depositions are performed before the etching step. In this instance, deposition of the remainder portion of the film is carried out using a remainder gaseous mixture that comprises a Si-containing gas such as $SiH_4$, an oxygen-containing gas such as $O_2$, and $H_2$ as a fluent gas. If the silicon oxide film is to be doped, the gaseous mixture may additionally include other precursor gases to provide the dopants to be incorporated into the film. Suitable D/S ratios for the remainder deposition are in the range 4–10, which the inventors have found permits the gap to be filled without significant redeposition when $H_2$ is used as a fluent gas, thereby permitting the remainder of the gap to be filled without void formation. In specific embodiments, the $H_2$ is provided to the process chamber with a flow rate between 500 and 1000 sccm, with the process chamber maintained at a pressure between 8 and 30 mtorr in some embodiments. While some applications operate the chamber with the throttle valve (valve to the exhaust foreline) in a fully open position, pressure in the chamber during such operation is controlled by the pumping capacity of the vacuum pump(s) and the rate at which gases are introduced into the chamber. At reduced chamber pressure levels, dissociated species have a longer mean free path and reduced angular distribution, thus enabling the species to reach and take place in chemical reactions at the bottom of trenches.

Figures 5A, 5B:
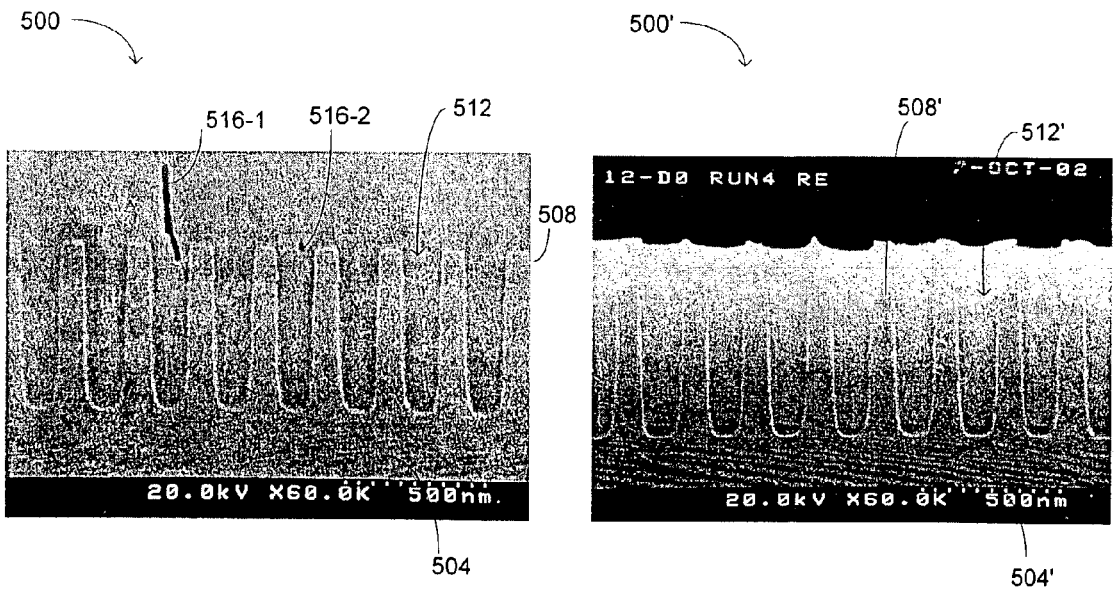
FIGS. 5A and 5B provide scanning-electron-microscopy images comparing gapfill characteristics of different HDP-CVD dep/etch/dep processes.

The inventors have conducted experiments to evaluate the gapfill capability of the method described in connection with FIG. 4 and results of some of these experiments are shown in FIGS. 5A and 5B. The results illustrate criticality where $H_2$ is used as the fluent gas for the remainder deposition and a heavier inert gas such as He or Ar is comprised by the fluent gas for the first deposition. Each of these two figures provides an SEM cross-sectional view of a substrate having a number of gaps into which dielectric material was deposited. In each case, an HDP dep/etch/dep process was used with $SiH_4$ and $O_2$ as precursor gases during the first and remainder deposition steps, which were separated by a biased $NF_3$ etch plasma etch. The results of FIG. 5A were produced with a process in which He was used as the fluent gas for both the first and remainder depositions, and the results of FIG. 5B were produced with the process described in connection with FIG. 4, using He as the fluent gas for the first deposition and $H_2$ as the fluent gas for the remainder deposition. FIG. 5A shows a resultant structure 500 in which voids 516 are evident in the silicon oxide deposited in gaps 512 between structures 508 formed over the substrate 504. In contrast, no such voids are evident in the resultant structure 500' shown in FIG. 5B in the silicon oxide deposited in corresponding gaps 512' between corresponding structures 508' formed over the substrate 504'.

The mechanism by which good gapfill characteristics are achieved with embodiments of the invention may be understood by noting that an exclusive use of $H_2$ as the fluent gas in all the deposition steps may result in damage to the underlying structures during the etching step on certain applications. While good gapfill characteristics are achieved with $H_2$ as the fluent gas, little material is deposited on the sidewalls in the gaps, providing little protection for the structures during the etching phase. Using He or a combination of inert gases during the first deposition provides some protective material on the sidewalls, with the later use of $H_2$ achieving improved gapfill. Embodiments that include $H_2$ with an inert gas during the first deposition may thus improve deposition further, provided the fraction of $H_2$ used is not so high as to eliminate the protective aspect of this step.

An alternative to using a mixture of an inert gas and $H_2$ as the fluent gas in the first deposition is to perform the etching phase after the first two depositions, followed by a further deposition to complete the gapfilling. This is illustrated with the exemplary embodiment shown with the flow diagram in FIG. 6 and is particularly useful when the substrate has densely packed areas and open areas since such a structure has an increased danger of damage to underlying structures in the open areas during the etching step. The first deposition step is performed at block 604 using a gaseous mixture that comprises a Si-containing gas such as $SiH_4$, an oxygen-containing gas such as $O_2$, and He as a fluent gas. In some instances, additional gases may be included in the gaseous mixture, such as to dope the deposited silicon oxide layer by including additional gases in the gaseous mixture, or by including an additional inert gas in the fluent gas to reduce costs and/or improve deposition uniformity. As for other embodiments, the fluent gas may, for example, be provided by a flow from a premixture of He and Ar, such as with greater than 95 wt. % He or greater than 99 wt. % He. Suitable D/S ratios for this first deposition are in the range 10–30, which produces sufficient cusping to protect underlying structures as previously discussed.

The first deposition is followed at block 608 by a second deposition in which the fluent gas is replaced with $H_2$. The precursor gases continue to comprise a Si- and oxygen-containing gases and will usually be the same precursor gases used in the first deposition step. A suitable D/S ratio for this second deposition is in the range 5–15. The two depositions at blocks 604 and 608 thus correspond to the depositions at blocks 216 and 224 described with respect to FIG. 2. The two deposition steps 604 and 608 may be used to deposit up to about 85% of the depth of the gap being filled. In one embodiment, the first deposition 604 is used to fill about 40–65% of the gap depth.

The etching step 612 may be performed using a fluorine-containing gas such as $NF_3$, and may be performed in situ or with a remote plasma in different embodiments. In a specific embodiment, the etching step is performed with a gaseous mixture that comprises $NF_3$, $O_2$, He, and Ar. The etching 612 may be performed anisotropically by providing an electrical bias to the substrate, with a suitable bias power density being in the range 0.9–3.2 $W/cm^2$ and preferably in the range 0.9–1.6 $W/cm^2$. In one embodiment, approximately 5–15% of the deposited thickness may be removed by the etching step 612. In some embodiments, the etching step is followed by a passivation step at block 614 to remove fluorine that may be incorporated in the film due to the etching steps. Such passivation may proceed by exposing the film to a passivation gas such as $O_2$, $O_3$, $N_2O$, and $N_2$ in combination with any of the preceding as described previously in connection with FIG. 4 and in U.S. patent application Ser. No. 10/138,189, which has been incorporated by reference.

The remainder of the gap is subsequently filled with a remainder (third) deposition step at block 616 using $H_2$ as the fluent gas. Usually, the same precursor gases used during the first and second depositions 604 and 608 will also be used during the remainder deposition step 616. In one embodiment, the precursor gases comprise a Si-containing gas such as $SiH_4$ and an oxygen-containing gas such as $O_2$ and may additionally include other precursor gases to provide specific dopants. Suitable D/S ratios for the remainder deposition are in the range 4–10, which permits filling without significant redeposition to permit the gap to be filled without void formation. In specific embodiments, the $H_2$ is provided to the process chamber with a flow rate between 500 and 1000 sccm, with the process chamber maintained at a pressure between 8 and 30 mtorr.

Figure 6:
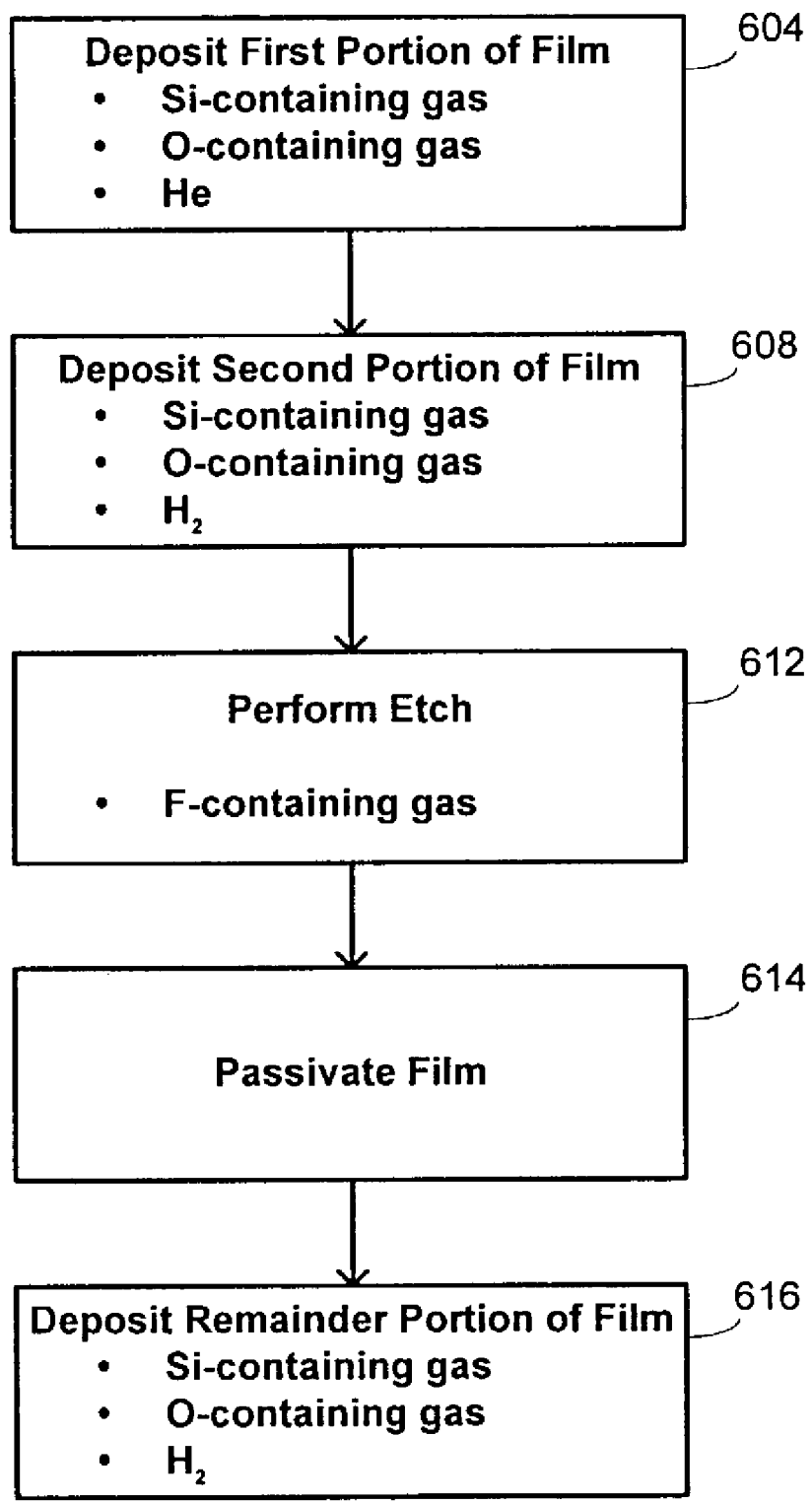
FIG. 6 is a flow diagram illustrating a method for depositing a film to fill a gap in a further embodiment of the invention.

It should be clear from the above description that the embodiments described in connection with FIG. 6 may be similar to the embodiments described in connection with FIG. 4 except that the single pre-etch deposition of FIG. 4 is replaced with a double pre-etch deposition in FIG. 6. This permits the use of $H_2$ as a fluent gas for the pre-etch deposition to take advantage of its better gapfill characteristics, but retains the initial deposition using He or another inert gas initially to form sufficient cusping to protect underlying structures during the subsequent etch step. The embodiments shown in FIG. 6 are thus generally able to fill gas having even larger aspect ratios that the embodiments shown in FIG. 4.

4. Exemplary Substrate Processing System

Figure 7A:
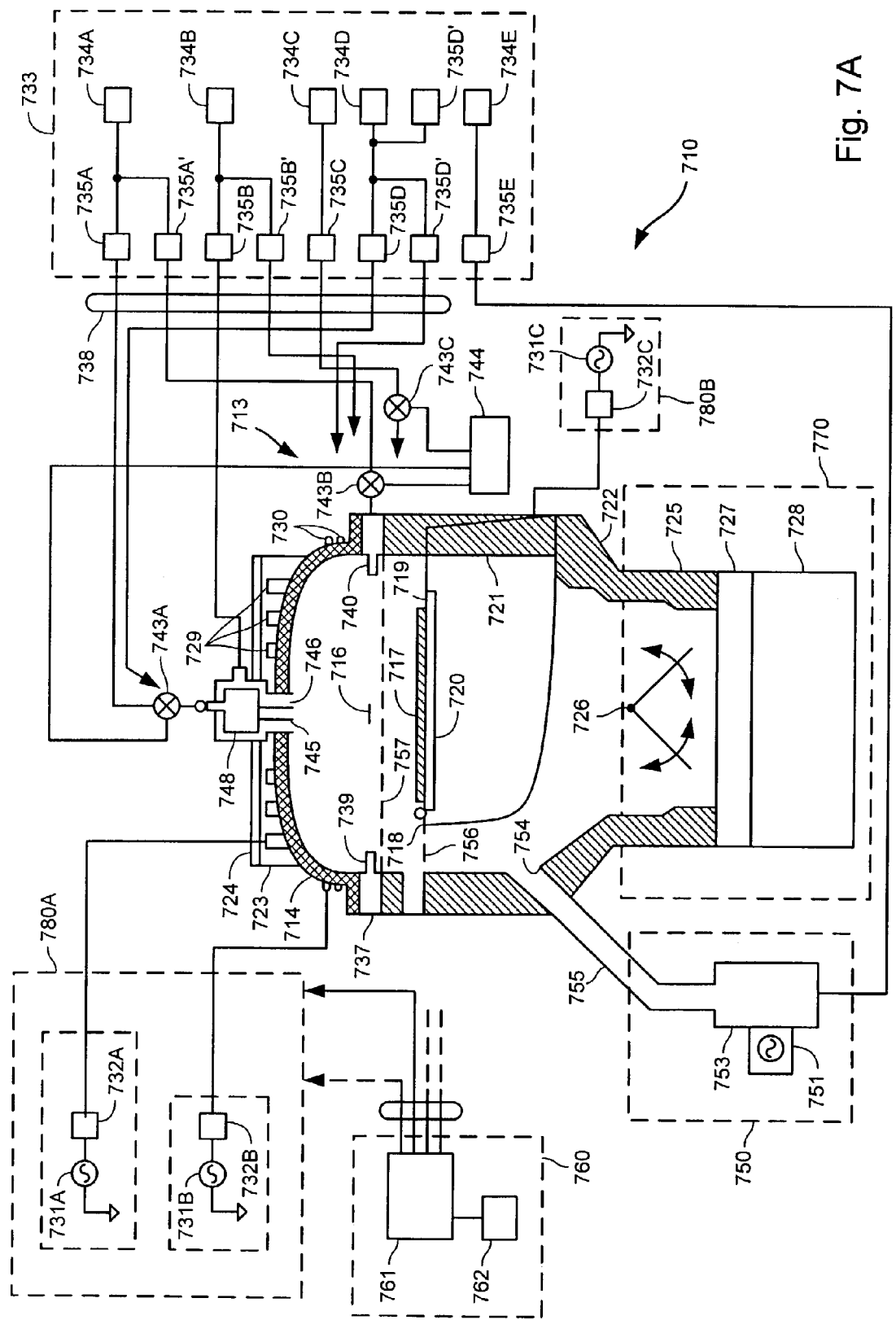
FIG. 7A is a simplified diagram of one embodiment of a high-density-plasma chemical-vapor deposition system according to the present invention.

The methods described above may be implemented with a variety of HDP-CVD systems, some of which are described in detail in connection with FIGS. 7A–7D. FIG. 7A schematically illustrates the structure of such an HDP-CVD system 710 in one embodiment. The system 710 includes a chamber 713, a vacuum system 770, a source plasma system 780A, a bias plasma system 780B, a gas delivery system 733, and a remote plasma cleaning system 750.

The upper portion of chamber 713 includes a dome 714, which is made of a ceramic dielectric material, such as aluminum oxide or aluminum nitride. Dome 714 defines an upper boundary of a plasma processing region 716. Plasma processing region 716 is bounded on the bottom by the upper surface of a substrate 717 and a substrate support member 718.

A heater plate 723 and a cold plate 724 surmount, and are thermally coupled to, dome 714. Heater plate 723 and cold plate 724 allow control of the dome temperature to within about ±10° C. over a range of about 100° C. to 200° C. This allows optimizing the dome temperature for the various processes. For example, it may be desirable to maintain the dome at a higher temperature for cleaning or etching processes than for deposition processes. Accurate control of the dome temperature also reduces the flake or particle counts in the chamber and improves adhesion between the deposited layer and the substrate.

The lower portion of chamber 713 includes a body member 722, which joins the chamber to the vacuum system. A base portion 721 of substrate support member 718 is mounted on, and forms a continuous inner surface with, body member 722. Substrates are transferred into and out of chamber 713 by a robot blade (not shown) through an insertion/removal opening (not shown) in the side of chamber 713. Lift pins (not shown) are raised and then lowered under the control of a motor (also not shown) to move the substrate from the robot blade at an upper loading position 757 to a lower processing position 756 in which the substrate is placed on a substrate receiving portion 719 of substrate support member 718. Substrate receiving portion 719 includes an electrostatic chuck 720 that secures the substrate to substrate support member 718 during substrate processing. In a preferred embodiment, substrate support member 718 is made from an aluminum oxide or aluminum ceramic material.

Vacuum system 770 includes throttle body 725, which houses twin-blade throttle valve 726 and is attached to gate valve 727 and turbo-molecular pump 728. It should be noted that throttle body 6 25 offers minimum obstruction to gas flow, and allows symmetric pumping. Gate valve 727 can isolate pump 728 from throttle body 725, and can also control chamber pressure by restricting the exhaust flow capacity when throttle valve 726 is fully open. The arrangement of the throttle valve, gate valve, and turbo-molecular pump allow accurate and stable control of chamber pressures from between about 1 millitorr to about 2 torr.

The source plasma system 780A includes a top coil 729 and side coil 730, mounted on dome 714. A symmetrical ground shield (not shown) reduces electrical coupling between the coils. Top coil 729 is powered by top source RF (SRF) generator 731A, whereas side coil 730 is powered by side SRF generator 731B, allowing independent power levels and frequencies of operation for each coil. This dual coil system allows control of the radial ion density in chamber 713, thereby improving plasma uniformity. Side coil 730 and top coil 729 are typically inductively driven, which does not require a complimentary electrode. In a specific embodiment, the top source RF generator 731A provides up to 2,500 watts of RF power at nominally 2 MHz and the side source RF generator 731B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 780B includes a bias RF ("BRF") generator 731C and a bias matching network 732C. The bias plasma system 780B capacitively couples substrate portion 717 to body member 722, which act as complimentary electrodes. The bias plasma system 780B serves to enhance the transport of plasma species (e.g., ions) created by the source plasma system 780A to the surface of the substrate. In a specific embodiment, bias RF generator provides up to 5,000 watts of RF power at 13.56 MHz.

RF generators 731A and 731B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art.

RF generators are typically designed to operate into a load with a characteristic impedance of 50 ohms. RF power may be reflected from loads that have a different characteristic impedance than the generator. This can reduce power transferred to the load. Additionally, power reflected from the load back to the generator may overload and damage the generator. Because the impedance of a plasma may range from less than 5 ohms to over 900 ohms, depending on the plasma ion density, among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 732A and 732B match the output impedance of generators 731A and 731B with their respective coils 729 and 730. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

Other measures may also help stabilize a plasma. For example, the RF control circuit can be used to determine the power delivered to the load (plasma) and may increase or decrease the generator output power to keep the delivered power substantially constant during deposition of a layer.

Figure 7B:
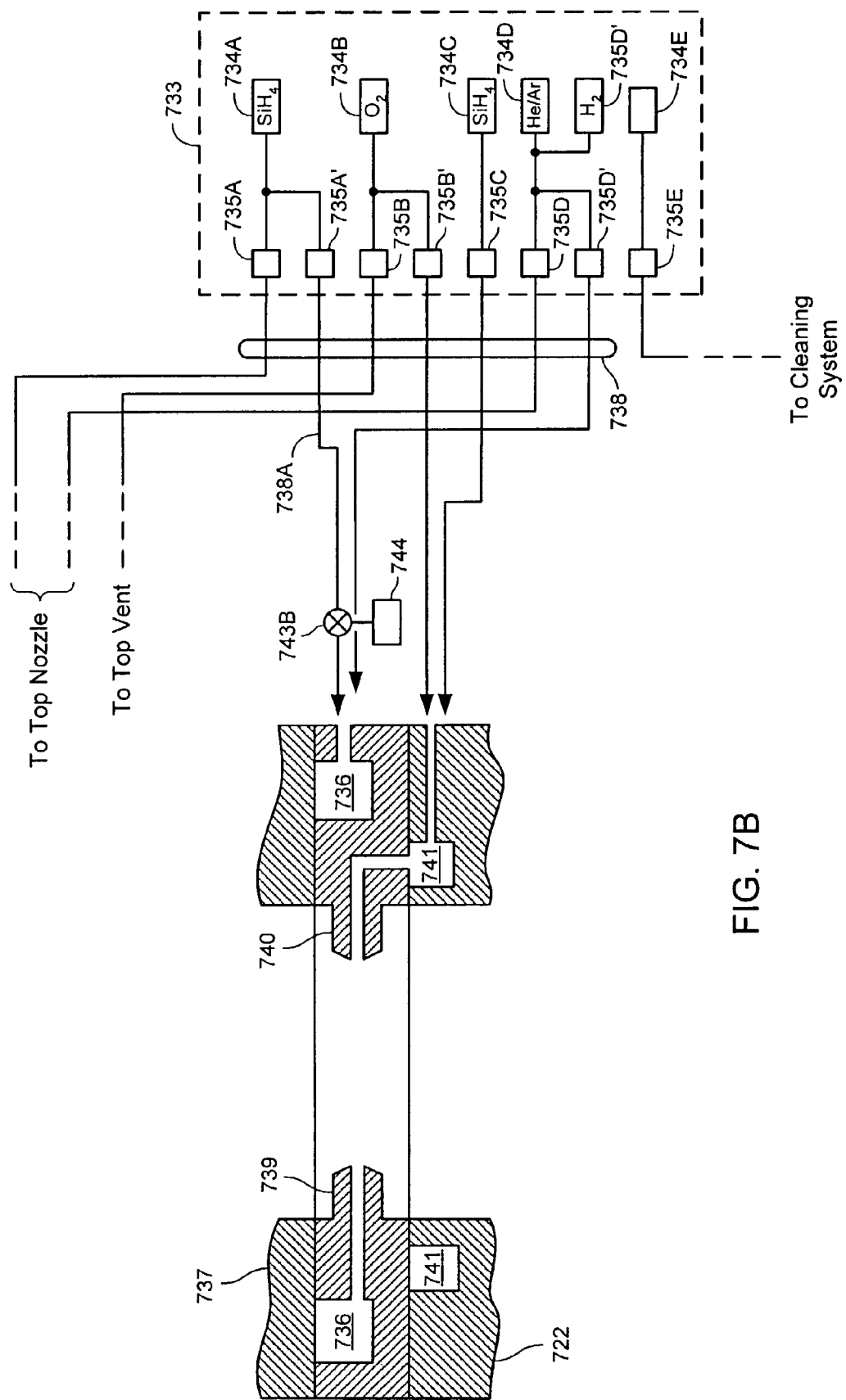
FIG. 7B is a simplified cross section of a gas ring that may be used in conjunction with the exemplary CVD processing chamber of FIG. 7A.

A gas delivery system 733 provides gases from several sources, 734A–734E chamber for processing the substrate via gas delivery lines 738 (only some of which are shown). As would be understood by a person of skill in the art, the actual sources used for sources 734A–734E and the actual connection of delivery lines 738 to chamber 713 varies depending on the deposition and cleaning processes executed within chamber 713. Gases are introduced into chamber 713 through a gas ring 737 and/or a top nozzle 745. FIG. 7B is a simplified, partial cross-sectional view of chamber 713 showing additional details of gas ring 737.

In one embodiment, first and second gas sources, 734A and 734B, and first and second gas flow controllers, 735A' and 735B', provide gas to ring plenum 736 in gas ring 737 via gas delivery lines 738 (only some of which are shown). Gas ring 737 has a plurality of source gas nozzles 739 (only one of which is shown for purposes of illustration) that provide a uniform flow of gas over the substrate. Nozzle length and nozzle angle may be changed to allow tailoring of the uniformity profile and gas utilization efficiency for a particular process within an individual chamber. In a preferred embodiment, gas ring 737 has 12 source gas nozzles made from an aluminum oxide ceramic.

Gas ring 737 also has a plurality of oxidizer gas nozzles 740 (only one of which is shown), which in a preferred embodiment are co-planar with and shorter than source gas nozzles 739, and in one embodiment receive gas from body plenum 741. In some embodiments it is desirable not to mix source gases and oxidizer gases before injecting the gases into chamber 713. In other embodiments, oxidizer gas and source gas may be mixed prior to injecting the gases into chamber 713 by providing apertures (not shown) between body plenum 741 and gas ring plenum 736. In one embodiment, third, fourth, and fifth gas sources, 734C, 734D, and 734D', and third and fourth gas flow controllers, 735C and 735D', provide gas to body plenum via gas delivery lines 738. Additional valves, such as 743B (other valves not shown), may shut off gas from the flow controllers to the chamber.

In embodiments where flammable, toxic, or corrosive gases are used, it may be desirable to eliminate gas remaining in the gas delivery lines after a deposition. This may be accomplished using a 3-way valve, such as valve 743B, to isolate chamber 713 from delivery line 738A and to vent delivery line 738A to vacuum foreline 744, for example. As shown in FIG. 7A, other similar valves, such as 743A and 743C, may be incorporated on other gas delivery lines. Such three-way valves may be placed as close to chamber 713 as practical, to minimize the volume of the unvented gas delivery line (between the three-way valve and the chamber). Additionally, two-way (on-off) valves (not shown) may be placed between a mass flow controller ("MFC") and the chamber or between a gas source and an MFC.

Referring again to FIG. 7A, chamber 713 also has top nozzle 745 and top vent 746. Top nozzle 745 and top vent 746 allow independent control of top and side flows of the gases, which improves film uniformity and allows fine adjustment of the film's deposition and doping parameters. Top vent 746 is an annular opening around top nozzle 745. In one embodiment, first gas source 734A supplies source gas nozzles 739 and top nozzle 745. Source nozzle MFC 735A' controls the amount of gas delivered to source gas nozzles 739 and top nozzle MFC 735A controls the amount of gas delivered to top gas nozzle 745. Similarly, two MFCs 735B and 735B' may be used to control the flow of oxygen to both top vent 746 and oxidizer gas nozzles 740 from a single source of oxygen, such as source 734B. The gases supplied to top nozzle 745 and top vent 746 may be kept separate prior to flowing the gases into chamber 713, or the gases may be mixed in top plenum 748 before they flow into chamber 713. Separate sources of the same gas may be used to supply various portions of the chamber.

A remote microwave-generated plasma cleaning system 750 is provided to periodically clean deposition residues from chamber components. The cleaning system includes a remote microwave generator 751 that creates a plasma from a cleaning gas source 734E (e.g., molecular fluorine, nitrogen trifluoride, other fluorocarbons or equivalents) in reactor cavity 753. The reactive species resulting from this plasma are conveyed to chamber 713 through cleaning gas feed port 754 via applicator tube 755. The materials used to contain the cleaning plasma (e.g., cavity 753 and applicator tube 755) must be resistant to attack by the plasma. The distance between reactor cavity 753 and feed port 754 should be kept as short as practical, since the concentration of desirable plasma species may decline with distance from reactor cavity 753. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 720, do not need to be covered with a dummy wafer or otherwise protected, as may be required with an in situ plasma cleaning process. In one embodiment, this cleaning system is used to dissociate atoms of the etchant gas remotely, which are then supplied to the process chamber 713. In another embodiment, the etchant gas is provided directly to the process chamber 713. In still a further embodiment, multiple process chambers are used, with deposition and etching steps being performed in separate chambers.

System controller 760 controls the operation of system 710. In a preferred embodiment, controller 760 includes a memory 762, such as a hard disk drive, a floppy disk drive (not shown), and a card rack (not shown) coupled to a processor 761. The card rack may contain a single-board computer (SBC) (not shown), analog and digital input/output boards (not shown), interface boards (not shown), and stepper motor controller boards (not shown). The system controller conforms to the Versa Modular European ("VME") standard, which defines board, card cage, and connector dimensions and types. The VME standard also defines the bus structure as having a 16-bit data bus and 24-bit address bus. System controller 731 operates under the control of a computer program stored on the hard disk drive or through other computer programs, such as programs stored on a removable disk. The computer program dictates, for example, the timing, mixture of gases, RF power levels and other parameters of a particular process. The interface between a user and the system controller is via a monitor, such as a cathode ray tube ("CRT") 765, and a light pen 766, as depicted in FIG. 7C.

Figure 7C:
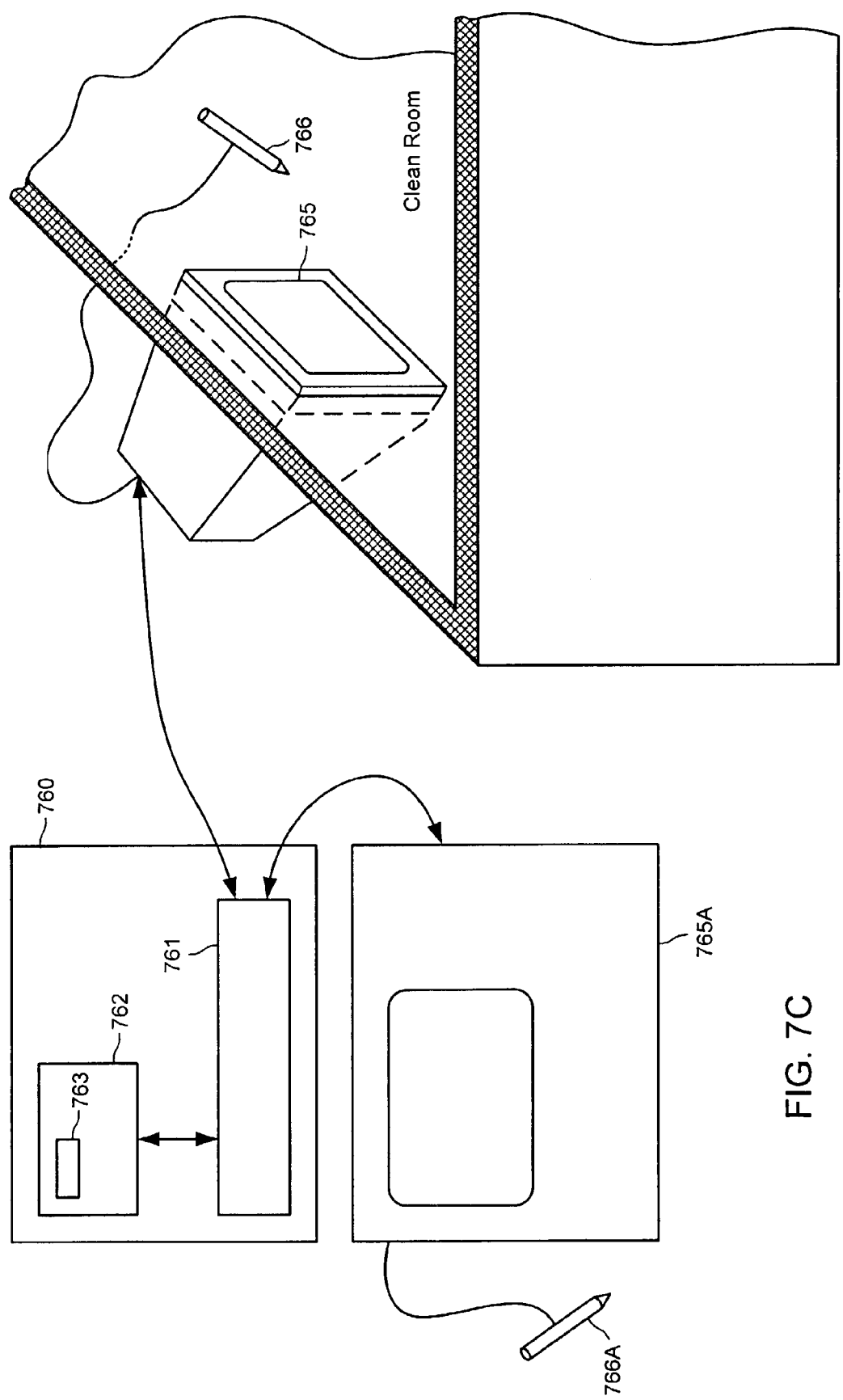
FIG. 7C is a simplified diagram of a monitor and light pen that may be used in conjunction with the exemplary CVD processing chamber of FIG. 7A.

FIG. 7C is an illustration of a portion of an exemplary system user interface used in conjunction with the exemplary CVD processing chamber of FIG. 7A. System controller 760 includes a processor 761 coupled to a computer-readable memory 762. Preferably, memory 762 may be a hard disk drive, but memory 762 may be other kinds of memory, such as ROM, PROM, and others.

System controller 760 operates under the control of a computer program 763 stored in a computer-readable format within memory 762. The computer program dictates the timing, temperatures, gas flows, RF power levels and other parameters of a particular process. The interface between a user and the system controller is via a CRT monitor 765 and a light pen 766, as depicted in FIG. 7C. In a preferred embodiment, two monitors, 765 and 765A, and two light pens, 766 and 766A, are used, one mounted in the clean room wall (665) for the operators and the other behind the wall (665A) for the service technicians. Both monitors simultaneously display the same information, but only one light pen (e.g. 766) is enabled. To select a particular screen or function, the operator touches an area of the display screen and pushes a button (not shown) on the pen. The touched area confirms being selected by the light pen by changing its color or displaying a new menu, for example.

The computer program code can be written in any conventional computer-readable programming language such as 68000 assembly language, C, C++, or Pascal. Suitable program code is entered into a single file, or multiple files, using a conventional text editor and is stored or embodied in a computer-usable medium, such as a memory system of the computer. If the entered code text is in a high level language, the code is compiled, and the resultant compiler code is then linked with an object code of precompiled windows library routines. To execute the linked compiled object code, the system user invokes the object code causing the computer system to load the code in memory. The CPU reads the code from memory and executes the code to perform the tasks identified in the program.

Figure 7D:
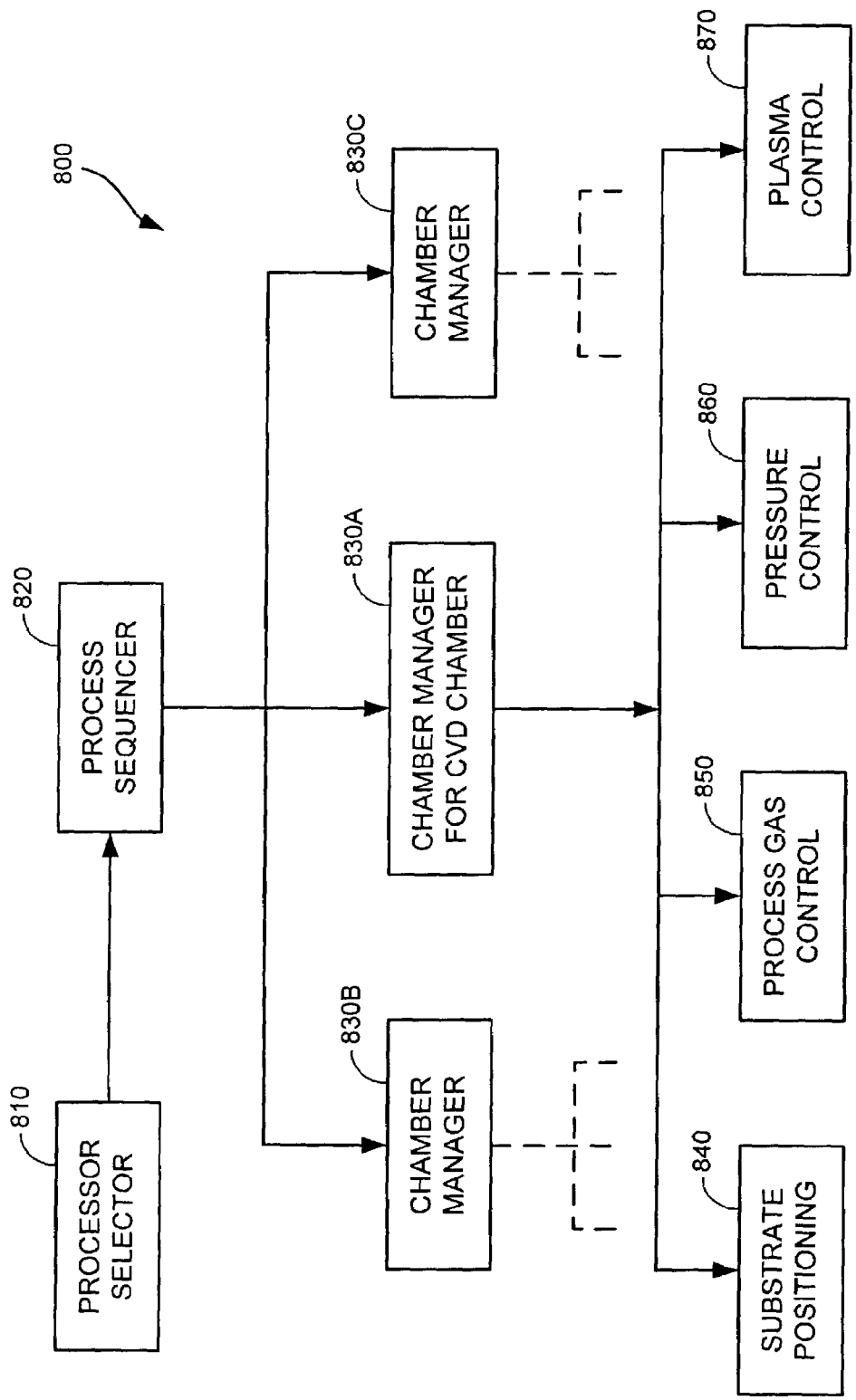
FIG. 7D is a flow chart of an exemplary process control computer program product used to control the exemplary CVD processing chamber of FIG. 7A.

FIG. 7D shows an illustrative block diagram of the hierarchical control structure of computer program 800. A user enters a process set number and process chamber number into a process selector subroutine 810 in response to menus or screens displayed on the CRT monitor by using the light pen interface. The process sets are predetermined sets of process parameters necessary to carry out specified processes, and are identified by predefined set numbers. Process selector subroutine 810 identifies (i) the desired process chamber in a multichamber system, and (ii) the desired set of process parameters needed to operate the process chamber for performing the desired process. The process parameters for performing a specific process relate to conditions such as process gas composition and flow rates, temperature, pressure, plasma conditions such as RF power levels, and chamber dome temperature, and are provided to the user in the form of a recipe. The parameters specified by the recipe are entered utilizing the light pen/CRT monitor interface.

The signals for monitoring the process are provided by the analog and digital input boards of system controller 760, and the signals for controlling the process are output on the analog and digital output boards of system controller 760.

A process sequencer subroutine 820 comprises program code for accepting the identified process chamber and set of process parameters from the process selector subroutine 810 and for controlling operation of the various process chambers. Multiple users can enter process set numbers and process chamber numbers, or a single user can enter multiple process set numbers and process chamber numbers; sequencer subroutine 820 schedules the selected processes in the desired sequence. Preferably, sequencer subroutine 820 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 820 can be designed to take into consideration the "age" of each particular user-entered request, or the present condition of the process chamber being used in comparison with the desired process conditions for a selected process, or any other relevant factor a system programmer desires to include for determining scheduling priorities.

After sequencer subroutine 820 determines which process chamber and process set combination is going to be executed next, sequencer subroutine 820 initiates execution of the process set by passing the particular process set parameters to a chamber manager subroutine 830A–830C, which controls multiple processing tasks in chamber 713 and possibly other chambers (not shown) according to the process set sent by sequencer subroutine 820.

Examples of chamber component subroutines are substrate positioning subroutine 840, process gas control subroutine 850, pressure control subroutine 860, and plasma control subroutine 870. Those having ordinary skill in the art will recognize that other chamber control subroutines can be included depending on what processes are selected to be performed in chamber 713. In operation, chamber manager subroutine 830A selectively schedules or calls the process component subroutines in accordance with the particular process set being executed. Chamber manager subroutine 830A schedules process component subroutines in the same manner that sequencer subroutine 820 schedules the process chamber and process set to execute. Typically, chamber manager subroutine 830A includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 7A and 7D. Substrate positioning subroutine 840 comprises program code for controlling chamber components that are used to load a substrate onto substrate support number 718. Substrate positioning subroutine 840 may also control transfer of a substrate into chamber 713 from, e.g., a plasma-enhanced CVD ("PECVD") reactor or other reactor in the multi-chamber system, after other processing has been completed.

Process gas control subroutine 850 has program code for controlling process gas composition and flow rates. Subroutine 850 controls the open/close position of the safety shut-off valves and also ramps up/ramps down the mass flow controllers to obtain the desired gas flow rates. All chamber component subroutines, including process gas control subroutine 850, are invoked by chamber manager subroutine 830A. Subroutine 850 receives process parameters from chamber manager subroutine 830A related to the desired gas flow rates.

Typically, process gas control subroutine 850 opens the gas supply lines, and repeatedly (i) reads the necessary mass flow controllers, (ii) compares the readings to the desired flow rates received from chamber manager subroutine 830A, and (iii) adjusts the flow rates of the gas supply lines as necessary. Furthermore, process gas control subroutine 850 may include steps for monitoring the gas flow rates for unsafe rates and for activating the safety shut-off valves when an unsafe condition is detected.

In some processes, an inert gas, such as argon, is flowed into chamber 713 to stabilize the pressure in the chamber before reactive process gases are introduced. For these processes, the process gas control subroutine 850 is programmed to include steps for flowing the inert gas into chamber 713 for an amount of time necessary to stabilize the pressure in the chamber. The steps described above may then be carried out.

Additionally, when a process gas is to be vaporized from a liquid precursor, for example, tetraethylorthosilane (TEOS), the process gas control subroutine 850 may include steps for bubbling a delivery gas such as helium through the liquid precursor in a bubbler assembly or for introducing the helium to a liquid injection valve. For this type of process, the process gas control subroutine 850 regulates the flow of the delivery gas, the pressure in the bubbler, and the bubbler temperature to obtain the desired process gas flow rates. As discussed above, the desired process gas flow rates are transferred to process gas control subroutine 850 as process parameters.

Furthermore, the process gas control subroutine 850 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 850 may also control the flow of heat-transfer gas, such as helium (He), through the inner and outer passages in the wafer chuck with an independent helium control (IHC) subroutine (not shown). The gas flow thermally couples the substrate to the chuck. In a typical process, the wafer is heated by the plasma and the chemical reactions that form the layer, and the He cools the substrate through the chuck, which may be water-cooled. This keeps the substrate below a temperature that may damage preexisting features on the substrate.

Pressure control subroutine 760 includes program code for controlling the pressure in chamber 713 by regulating the size of the opening of throttle valve 726 in the exhaust portion of the chamber. There are at least two basic methods of controlling the chamber with the throttle valve. The first method relies on characterizing the chamber pressure as it relates to, among other things, the total process gas flow, the size of the process chamber, and the pumping capacity. The first method sets throttle valve 726 to a fixed position. Setting throttle valve 726 to a fixed position may eventually result in a steady-state pressure.

Alternatively, the chamber pressure may be measured, with a manometer for example, and the position of throttle valve 726 may be adjusted according to pressure control subroutine 860, assuming the control point is within the boundaries set by gas flows and exhaust capacity. The former method may result in quicker chamber pressure changes, as the measurements, comparisons, and calculations associated with the latter method are not invoked. The former method may be desirable where precise control of the chamber pressure is not required, whereas the latter method may be desirable where an accurate, repeatable, and stable pressure is desired, such as during the deposition of a layer.

When pressure control subroutine 860 is invoked, the desired, or target, pressure level is received as a parameter from chamber manager subroutine 830A. Pressure control subroutine 860 measures the pressure in chamber 713 by reading one or more conventional pressure manometers connected to the chamber; compares the measured value(s) to the target pressure; obtains proportional, integral, and differential (PID) values from a stored pressure table corresponding to the target pressure, and adjusts throttle valve 726 according to the PID values obtained from the pressure table. Alternatively, pressure control subroutine 860 may open or close throttle valve 726 to a particular opening size to regulate the pressure in chamber 713 to a desired pressure or pressure range.

Plasma control subroutine 870 comprises program code for controlling the frequency and power output setting of RF generators 731A and 731B and for tuning matching networks 732A and 732B. Plasma control subroutine 870, like the previously described chamber component subroutines, is invoked by chamber manager subroutine 830A.

An example of a system that may incorporate some or all of the subsystems and routines described above would be the ULTIMA™ system, manufactured by APPLIED MATERIALS, INC., of Santa Clara, Calif., configured to practice the present invention. Further details of such a system are disclosed in commonly assigned U.S. Pat. No. 6,170,428, filed Jul. 15, 1996, entitled "Symmetric Tunable Inductively-Coupled HDP-CVD Reactor," having Fred C. Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference. The described system is for exemplary purpose only. It would be a matter of routine skill for a person of skill in the art to select an appropriate conventional substrate processing system and computer control system to implement the present invention.

Those of ordinary skill in the art will realize that processing parameters can vary for different processing chambers and different processing conditions, and that different precursors can be used without departing from the spirit of the invention. Other variations will also be apparent to persons of skill in the art. These equivalents and alternatives are intended to be included within the scope of the present invention. Therefore, the scope of this invention should not be limited to the embodiments described, but should instead be defined by the following claims.

What is claimed is:

1. A method for depositing a film to fill a gap in a surface of a substrate, the method comprising:

depositing a first portion of the film in the gap using a first gaseous mixture in a high-density-plasma chemical-vapor-deposition (HDP-CVD) process, the first gaseous mixture consisting of a first process gas and a first fluent gas, the first process gas having chemical elements incorporated into the film and the first fluent gas not having chemical elements incorporated into the film, wherein the first process gas comprises a silicon-containing gas and an oxygen-containing gas;

thereafter, etching the film with a fluorine-containing gas; and thereafter, depositing a remainder of the film in the gap using a remainder gaseous mixture in an HDP-CVD process, the remainder gaseous mixture consisting of a second process gas and a second fluent gas, the second process gas having chemical elements incorporated into the film and the second fluent gas not having chemical elements incorporated into the film, wherein the second process gas comprises a silicon-containing gas and an oxygen-containing gas, wherein the second fluent gas has a lower average molecular weight than the first fluent gas.

2. The method recited in claim 1 wherein the first fluent gas comprises an inert gas and the second fluent gas comprises $H_2$.

3. The method recited in claim 2 wherein the first fluent gas comprises He.

4. The method recited in claim 3 wherein the first fluent gas further comprises $H_2$.

5. The method recited in claim 2 wherein the first fluent gas comprises He and Ar.

6. The method recited in claim 2 wherein the first fluent gas comprises a mixture of Ar and He.

7. The method recited in claim 6 wherein the mixture of Ar and He comprises greater than 95 wt. % He.

8. The method recited in claim 6 wherein the mixture of Ar and He comprises greater than 99 wt. % He.

9. The method recited in claim 1 wherein etching the film comprises etching the film with an etching gaseous mixture comprising the fluorine-containing gas, an oxygen-containing gas, He, and Ar.

10. The method recited in claim 1 wherein etching the film comprises applying an electrical bias to the substrate.

11. The method recited in claim 1 wherein depositing the first portion of the film comprises depositing the first portion of the film with a deposition/sputter ratio within the range of 10–30, wherein the deposition/sputter ratio is defined as a ratio of a sum of a net deposition rate and a blanket sputtering rate to the blanket sputtering rate.

12. The method recited in claim 1 wherein depositing the remainder of the film comprises depositing the remainder of the film with a deposition/sputter ratio within the range of 4–10, wherein the deposition/sputter ratio is defined as a ratio of a sum of a net deposition rate and a blanket sputtering rate to the blanket sputtering rate.

13. The method recited in claim 1 wherein depositing the first portion of the film comprises filling between 35% and 85% of a depth of the gap.

14. The method recited in claim 1 wherein etching the film comprises removing between 5% and 15% of a thickness of the first portion of the film.

15. The method recited in claim 1 further comprising passivating the film after etching the film and before depositing the remainder of the film.

16. The method recited in claim 15 wherein passivating the film comprises exposing the film to an oxygen atmosphere.

17. The method recited in claim 1 further comprising depositing a second portion of the film in the gap using a second gaseous mixture in an HDP-CVD process, the second gaseous mixture comprising a silicon-containing gas, an oxygen-containing gas, and $H_2$, wherein depositing the second portion is performed after depositing the first portion and before etching the film.

18. The method recited in claim 17 wherein depositing the second portion of the film comprises depositing the second portion of the film with a second deposition/sputter ratio within the range of 5–15, wherein the second deposition/sputter ratio is defined as a ratio of a sum of a second net deposition rate and a second blanket sputtering rate to the second blanket sputtering rate.

19. The method recited in claim 18 wherein depositing the first portion of the film comprises depositing the first portion of the film with a first deposition/sputter ratio within the range of 10–30, wherein the first deposition/sputter ratio is defined as a ratio of a sum of a first net deposition rate and a first blanket sputtering rate to the first blanket sputtering rate.

20. The method recited in claim 17 wherein depositing the first portion of the film comprises filling between 40% and 65% of a depth of the gap.

21. The method recited in claim 20 wherein depositing the second portion of the film comprises filling an additional 20%–45% of the depth of the gap.

22. The method recited in claim 17 etching the film comprises removing between 5% and 15% of a combined thickness of the first and second portions of the film.

23. A computer-readable storage medium having a computer-readable program embodied therein for directing operation of a substrate processing system including a process chamber; a plasma generation system; a substrate holder; and a gas delivery system configured to introduce gases into the process chamber, the computer-readable program including instructions for operating the substrate processing system to deposit a film to fill a gap in a surface of a substrate disposed in the process chamber in accordance with the following:
depositing a first portion of the film in the gap using a first gaseous mixture in a high-density-plasma chemical-vapor-deposition (HDP-CVD) process, the first gaseous mixture consisting of a first process gas and a first fluent gas, the first process gas having chemical elements incorporated into the film and the first fluent gas not having chemical elements incorporated into the film, wherein the first process gas comprises a silicon-containing gas and an oxygen-containing gas;
thereafter, etching the film with a fluorine-containing gas; and
thereafter, depositing a remainder of the film in the gap using a remainder gaseous mixture in an HDP-CVD process, the remainder gaseous mixture consisting of a second process gas and a second fluent gas, the second process gas having chemical elements incorporated into the film and the second fluent gas not having chemical elements incorporated into the film, wherein the second process gas comprises a silicon-containing gas and an oxygen-containing gas,
wherein the second fluent gas has a lower average molecular weight than the first fluent gas.

24. The computer-readable storage medium recited in claim 23 wherein the first fluent gas comprises an inert gas and the second fluent gas comprises $H_2$.

25. The computer-readable storage medium recited in claim 24 wherein the first fluent gas comprises He.

26. The computer-readable storage medium recited in claim 25 wherein the first fluent gas further comprises $H_2$.

27. The computer-readable storage medium recited in claim 24 wherein the first fluent gas comprises a mixture of He and Ar.

28. The computer-readable storage medium recited in claim 23 wherein etching the film comprises applying an electrical bias to the substrate.

29. The computer-readable storage medium recited in claim 23 wherein the computer-readable program further includes instructions for depositing a second portion of the film in the gap using a second gaseous mixture in an HDP-CVD process, the second gaseous mixture comprising a silicon-containing gas, an oxygen-containing gas, and $H_2$, wherein depositing the second portion is performed after depositing the first portion and before etching the film.

30. A substrate processing system comprising:
a housing defining a process chamber;
a high-density plasma generating system operatively coupled to the process chamber;
a substrate holder configured to hold a substrate during substrate processing;
a gas-delivery system configured to introduce gases into the process chamber;
a pressure-control system for maintaining a selected pressure within the process chamber;
a controller for controlling the high-density plasma generating system, the gas-delivery system, and the pressure-control system; and
a memory coupled to the controller, the memory comprising a computer-readable medium having a computer-readable program embodied therein for directing operation of the substrate processing system to fill a gap in a surface of the substrate, the computer-readable program including:
instructions to deposit a first portion of the film in the gap using a first gaseous mixture in a high-density-plasma chemical-vapor-deposition (HDP-CVD) process, the first gaseous mixture consisting of a first process gas and a first fluent gas, the first process gas having chemical elements incorporated into the film and the first fluent gas not having chemical elements incorporated into the film, wherein the first process gas comprises a silicon-containing gas and an oxygen-containing gas;
instructions thereafter to etch the film with a fluorine-containing gas; and
instructions thereafter to deposit a remainder of the film in the gap using a remainder gaseous mixture in an HDP-CVD process, the remainder gaseous mixture consisting of a second process gas and a second fluent gas, the second process gas having chemical elements incorporated into the film and the second fluent gas not having chemical elements incorporated into the film, wherein the second process gas comprises a silicon-containing gas and an oxygen-containing gas,
wherein the second fluent gas has a lower average molecular weight than the first fluent gas.

31. The substrate processing system recited in claim 30 wherein the second fluent gas comprises $H_2$.

32. The substrate processing system recited in claim 31 wherein the first fluent gas comprises He.

33. The substrate processing system recited in claim 32 wherein the first fluent gas further comprises $H_2$.

34. The substrate processing system recited in claim 31 wherein the first fluent gas comprises a mixture of Ar and He.

35. The substrate processing system recited in claim 30 wherein the instructions for etching the film comprise instructions for applying an electrical bias to the substrate.

36. The substrate processing system recited in claim 30 wherein the computer-readable program further includes instructions for depositing a second portion of the film in the gap using a second gaseous mixture in an HDP-CVD process, the second gaseous mixture comprising a silicon-containing gas, an oxygen-containing gas, and $H_2$, wherein the second portion is deposited after the first portion and before the etching.

* * * * *